(12) United States Patent
Boakye et al.

(10) Patent No.: US 9,831,852 B2
(45) Date of Patent: Nov. 28, 2017

(54) METHODS AND APPARATUS FOR A CONFIGURABLE HIGH-SIDE NMOS GATE CONTROL WITH IMPROVED GATE TO SOURCE VOLTAGE REGULATION

(71) Applicant: Texas Instruments Incorporated, Dallas, TX (US)

(72) Inventors: Emmanuel Osei Boakye, Dallas, TX (US); Roland Karl Son, Dallas, TX (US); Juergen Luebbe, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/244,814

(22) Filed: Aug. 23, 2016

(65) Prior Publication Data
US 2017/0063369 A1    Mar. 2, 2017

Related U.S. Application Data

(60) Provisional application No. 62/212,293, filed on Aug. 31, 2015.

(51) Int. Cl.
*H03K 17/687* (2006.01)
*H03K 3/0233* (2006.01)
*H02M 1/08* (2006.01)
*H03K 17/082* (2006.01)

(52) U.S. Cl.
CPC .......... *H03K 3/02337* (2013.01); *H02M 1/08* (2013.01); *H03K 17/0822* (2013.01)

(58) Field of Classification Search
USPC ........ 327/109, 291, 298, 299, 419, 425, 427
See application file for complete search history.

(56) References Cited

U.S. PATENT DOCUMENTS

| | | | |
|---|---|---|---|
| 5,233,314 A | 8/1993 | McDermott et al. | |
| 5,418,673 A | 5/1995 | Wong | |
| 7,564,300 B2* | 7/2009 | Lee | G05F 1/563 327/536 |
| 7,724,046 B2 | 5/2010 | Wendt et al. | |
| 7,936,154 B2* | 5/2011 | Lee | G11C 5/145 323/266 |
| 7,973,592 B2 | 7/2011 | Pan | |
| 8,934,307 B2* | 1/2015 | Chu | G11C 5/145 365/185.2 |

(Continued)

OTHER PUBLICATIONS

International Search Report and Written Opinion for PCT/US2016/049686 dated Dec. 1, 2016.

*Primary Examiner* — An Luu
(74) *Attorney, Agent, or Firm* — Michael A. Davis, Jr.; Charles A. Brill; Frank D. Cimino

(57) ABSTRACT

In described examples, a transistor has: a source and a drain coupled between a supply voltage and an output terminal; and a gate terminal. A charge pump has: an output node coupled to the gate terminal; and a clock input. An oscillator is coupled to generate a clock signal. A clock enable circuit is coupled to: receive the clock signal; and selectively output the clock signal to the clock input, responsive to an enable signal. A comparator is coupled to output the enable signal in response to a comparison between a reference current and a current through a series resistor. The series resistor is coupled to the gate terminal.

19 Claims, 6 Drawing Sheets

(56) References Cited

U.S. PATENT DOCUMENTS

| | | |
|---|---|---|
| 9,007,100 B2 | 4/2015 | Asam et al. |
| 2015/0028922 A1 | 1/2015 | Turkson et al. |
| 2015/0091542 A1 | 4/2015 | Notani |

* cited by examiner

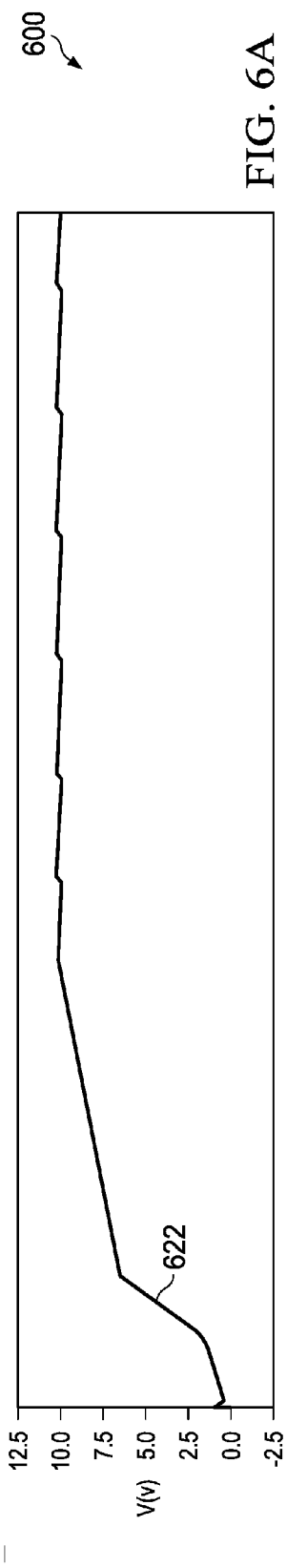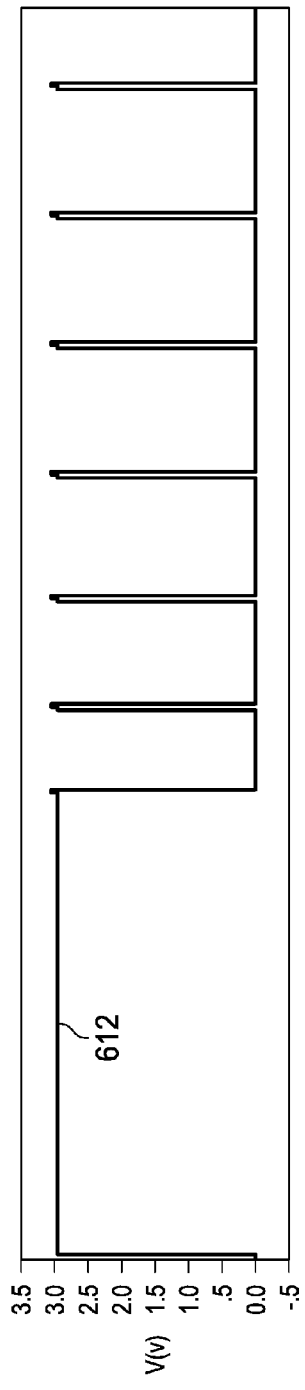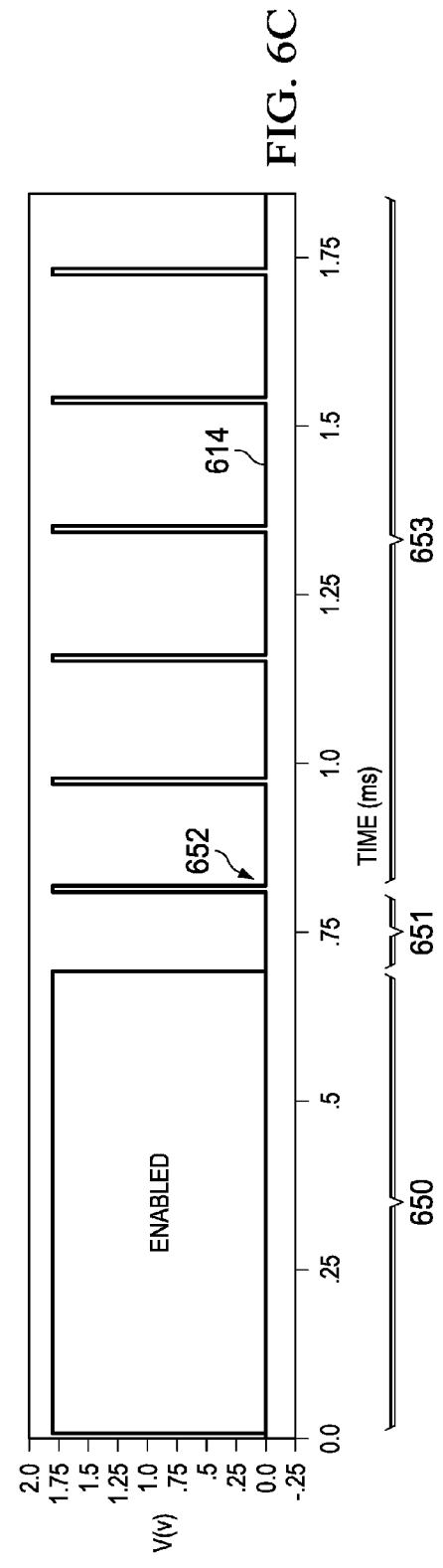
FIG. 6A
FIG. 6B
FIG. 6C

METHODS AND APPARATUS FOR A CONFIGURABLE HIGH-SIDE NMOS GATE CONTROL WITH IMPROVED GATE TO SOURCE VOLTAGE REGULATION

CROSS-REFERENCE TO RELATED APPLICATIONS

This application claims the benefit of priority under 35 U.S.C. §119(e) to co-owned U.S. Provisional Patent Application Ser. No. 62/212,293, filed Aug. 31, 2015, entitled "METHOD AND CIRCUITRY FOR A CONFIGURABLE HIGH-SIDE NMOS GATE CONTROL WITH IMPROVED VGS REGULATION, ACCURACY AND EFFICIENCY," naming Emmanuel Boakye et. al. as inventors, which application is hereby incorporated by reference in its entirety herein.

TECHNICAL FIELD

This relates generally to electronic circuitry for controlling a gate voltage, and more particularly to configurable n-channel MOSFET gate driver control with improved regulation, accuracy and efficiency.

BACKGROUND

N-channel enhancement-mode metal oxide semiconductor field-effect transistors (n-channel MOSFETs) are widely used in load switching applications for their low on-resistance and compact size. When the n-channel MOSFET (NFET) is positioned between a voltage supply terminal and a load, it is referred to as a "high side" driver. In this configuration, the source voltage of the NFET is dependent on the load resistance and load current. To turn on an NFET, the gate voltage of the NFET must have a sufficiently high voltage, so that a voltage from the gate to the source (Vgs) is greater than a threshold voltage (Vt) for the NFET.

SUMMARY

In described examples, a transistor has: a source and a drain coupled between a supply voltage and an output terminal; and a gate terminal. A charge pump has: an output node coupled to the gate terminal; and a clock input. An oscillator is coupled to generate a clock signal. A clock enable circuit is coupled to: receive the clock signal; and selectively output the clock signal to the clock input, responsive to an enable signal. A comparator is coupled to output the enable signal in response to a comparison between a reference current and a current through a series resistor. The series resistor is coupled to the gate terminal.

BRIEF DESCRIPTION OF THE DRAWINGS

FIGS. 6A-6C are graphs illustrating simulation results of the gate control circuit of FIG. 4.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" can include connections made with intervening elements, and additional elements and various connections can exist between any elements that are "coupled."

To ensure a sufficient voltage with sufficient current drive is always available for an NFET configured as a high side driver, a gate driver circuit may use a charge pump to provide the necessary gate to source voltage ($V_{GS}$). Depending on the NFET characteristics, additional circuitry might be needed to limit $V_{GS}$ to prevent over-voltage damage of the gate structure. $V_{GS}$ values in the 2V to 10V range are possible, depending on the NFET vendor and the application. When the high side driver circuit is active and delivering power to a load, tight regulation of $V_{GS}$ to maintain the NFET just within the "on" operating region will reduce current consumption and maximize reliability.

One solution for a power FET gate driver uses an avalanche diode or Zener diode to clamp the gate-to-source voltage. The Zener diode solution has several design tradeoffs. The minimum breakdown voltage (Vz) for a Zener diode in a specific semiconductor process is a relatively high voltage. Although some discrete Zener diodes might have a minimum Vz starting at a couple of volts, most semiconductor processes currently used for manufacturing integrated circuits do not offer a Vz less than about six volts. This minimum Vz voltage restricts the use of the Zener diode as a gate voltage clamp for power FETs. Another tradeoff in this approach is the power consumption. While regulating the gate voltage at the minimum voltage Vz, the Zener diode also requires a minimum Zener current. This minimum Zener current is consumed when the power FET is on and the gate voltage is supplied by a charge pump. The charge pump size has to be increased to provide the minimum Zener current. Process variations and temperature stability are other characteristics that add variability to the Zener diode solution.

Figure 1:
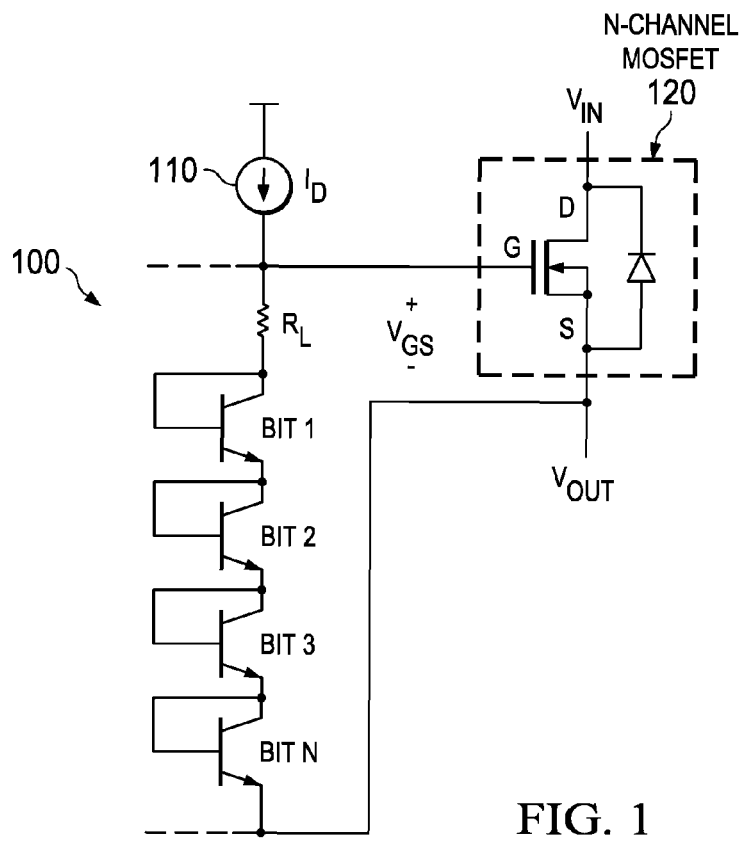
FIG. 1 is a circuit diagram of a band-gap gate voltage clamp.

In another solution, a band-gap circuit can be arranged to clamp the gate voltage $V_{GS}$ of the power FET to a predetermined level. FIG. 1 is a circuit diagram of a band-gap clamp circuit 100. Band-gap clamp circuit 100 has a current limiting resistor $R_L$ coupled in series with a string of bits, labeled "Bit 1" through "Bit N." Each bit is a bipolar transistor arranged in a diode configuration. Each bit in the chain provides a base-to-emitter voltage drop ($V_{BE}$) of around 1V. The drive current source $I_D$ drives the band-gap clamp. A charge pump (not shown for clarity) supplies current to the gate for the high side n-channel MOSFET (NFET) 120. The NFET 120 has a voltage supply $V_{IN}$ coupled to the drain terminal and an output voltage $V_{OUT}$ coupled at the source terminal. The clamped gate-to-source voltage $V_{GS}$ applied to the NFET 120 is represented by Equation (1):

$$V_{GS} = I_D * R_L + m * V_{BE} \quad (1)$$

where m=number of bits, and $V_{BE}$ is the base to emitter voltage of the bipolar transistors forming the bits.

In an example, the voltage $V_{BE}$ of each of the bits is usually 1.2V, making this voltage clamp programmable by varying the number of bits. To make the gate-to-source voltage $V_{GS}$ of the band-gap clamp somewhat independent of NFET gate leakage current, the drain current $I_D$ needs to be much greater than the gate leakage current. The band-gap clamp solution of FIG. 1 is more stable than a Zener diode solution; however, the high drive current $I_D$ required to make the band-gap clamp voltage independent of the power FET gate leakage consumes power that is too great to be classified as a low power solution. The bandgap clamp solution also leads to a relatively large charge pump circuit with relatively large semiconductor substrate area.

Figure 2:
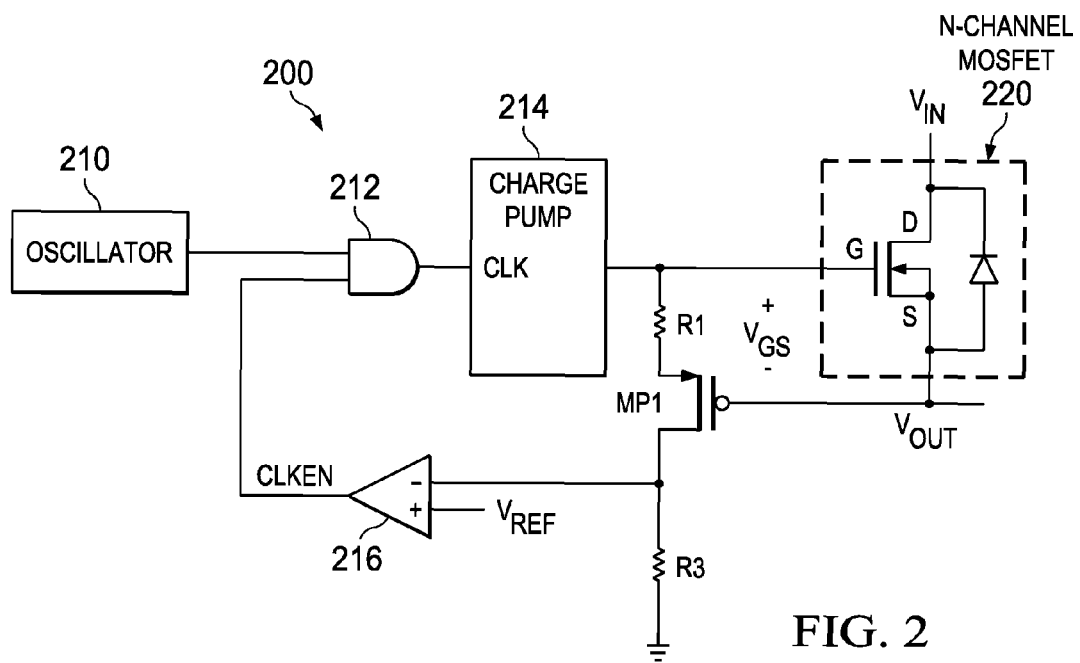
FIG. 2 is a circuit diagram of a gate voltage regulation circuit.

FIG. 2 is a circuit diagram of another gate voltage regulation circuit 200. Circuit 200 includes: oscillator 210; AND gate 212; charge pump 214; comparator 216; NFET 220; transistor MP1; and a pair of resistors R1 and R3. The oscillator 210 outputs a clock signal to an input terminal of AND gate 212. The second input terminal of AND gate 212 is coupled to the CLKEN signal output by comparator 216. The output of AND gate 212 is coupled to a CLK input of charge pump 214. The output of charge pump 214 couples to the gate of the NFET 220. Resistor R1 couples the gate of NFET 220 and the source terminal of transistor MP1. The gate terminal of transistor MP1 couples to the source terminal of NFET 220. The drain terminal of transistor MP1 couples to the second terminal of the comparator 216 and a terminal of R3. The second terminal of R3 couples to ground.

In FIG. 2, transistor MP1 and resistors R1 and R3 sense the gate to source voltage $V_{GS}$ of the NFET 220. The gate to source voltage $V_{GS}$ is represented by Equation (2):

$$V_{GS} = V_{REF}\left(\frac{R1}{R3}\right) + V_{T1} \tag{2}$$

where $V_{REF}$ is the reference voltage at the input to the comparator, and $V_{T1}$ is the threshold voltage of MP1.

The gate-to-source voltage $V_{GS}$ can be regulated to a predetermined voltage level using the ratio R1/R3 in the circuit 200. This solution is an improvement over the Zener diode or the band-gap clamp method. However, as shown in Equation (2), the gate-to-source voltage depends directly on the threshold voltage of the transistor MP1 ($V_{T1}$). The threshold voltage $V_{T1}$ can change as much as half a volt across process and temperature variation, and that variation can therefore have extreme effects on the $V_{GS}$ regulation.

Figure 3:
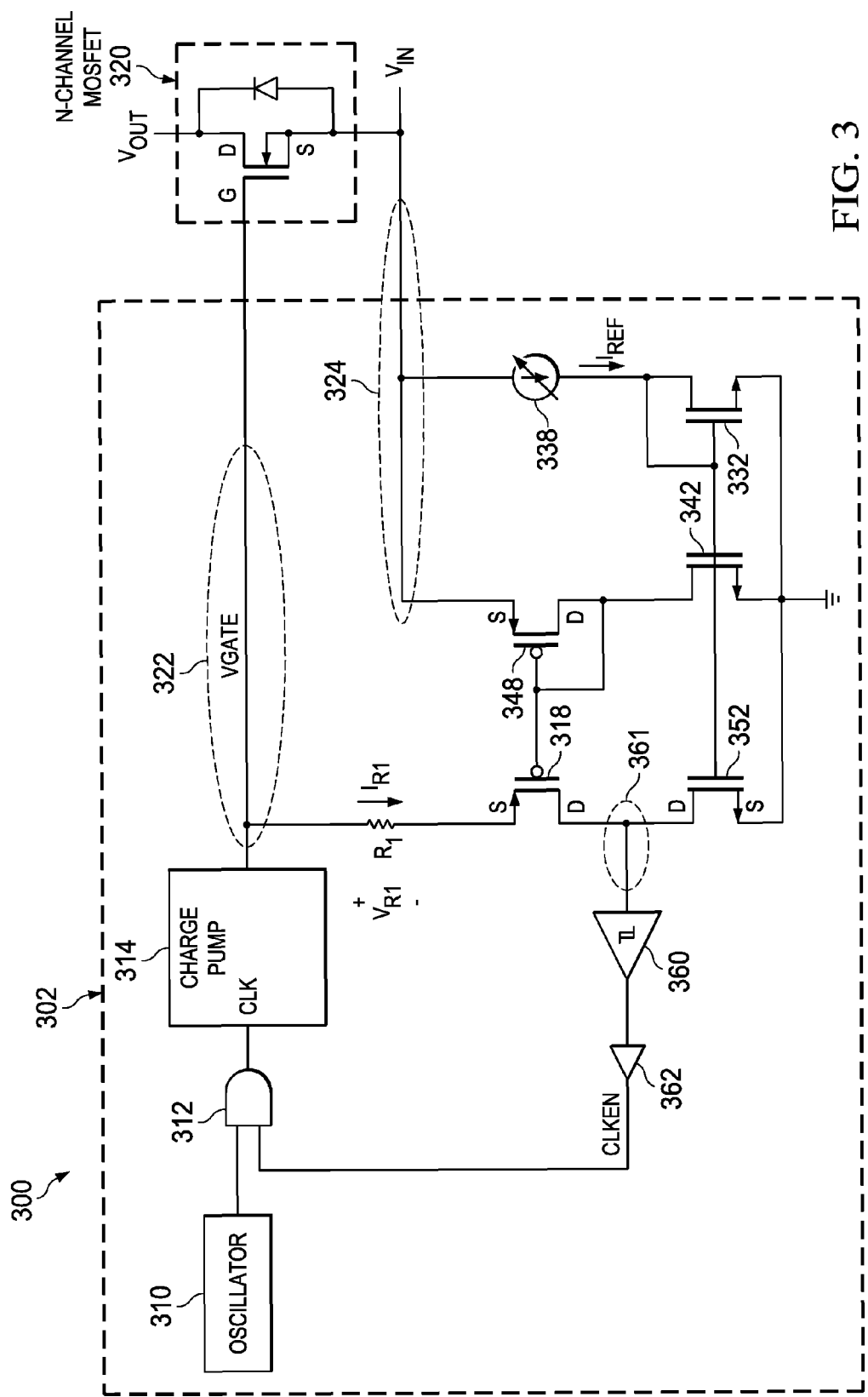
FIG. 3 is a circuit diagram of a configurable gate control circuit of example embodiments coupled to a power FET.

FIG. 3 is a circuit schematic of an embodiment for a configurable gate control circuit 302. In FIG. 3, circuit 302 drives the gate of an NFET 320. In FIG. 3, reference labels for components similar to the components shown in FIG. 2 are similar, for clarity. For example, the oscillator 310 in FIG. 3 is similar to the oscillator 210 in FIG. 2. In this example embodiment, the gate control circuit 302 senses the gate voltage VGATE with a common gate comparator.

In the example embodiment 300, gate driver circuit 302 is shown coupled to an n-channel power FET 320. Gate driver circuit 302 includes: an oscillator OSC 310; AND gate 312; charge pump 314; resistor R1; buffer 362; comparator 360; current source 338; a pair of p-channel MOSFETs (PFETs) 318 and 348 that are matched in size and located in close proximity to each other to reduce process variations and to match the transistors closely; and three NFETs 332, 342 and 352 that are matched in size and also located in close proximity to each other.

Gate driver circuit 302 is coupled to the gate terminal of power FET 320 at gate node 322 and to the source terminal at node 324. The source terminal is also coupled to an input voltage $V_{IN}$.

In an example embodiment, the components of gate driver circuit 302 can be formed as a single integrated circuit, with the NFET 320 being formed as a separate integrated circuit. In an alternative embodiment, the oscillator 310 can be external to the gate driver circuit 302. Within the gate driver circuit 302, oscillator OSC 310 couples to a first input terminal of AND gate 312. The output of AND gate 312 is coupled to the CLK input of charge pump 314. The output of the charge pump 314, the gate voltage VGATE, couples to the node 322. A first terminal of resistor R1 couples to node 322 and the second terminal of resistor R1 couples to the source terminal of transistor 318. The gate of transistor 318 and the gate of transistor 348 couple together at a common gate node. The gate of transistor 348 couples to the drain of transistor 348 and to the drain of transistor 342. The drain of transistor 318 couples to the drain of transistor 352 and to the input of comparator 360. In this example embodiment, comparator 360 is implemented as a Schmitt trigger. The output of comparator 360 couples to the input of the buffer 362. The output of buffer 362, labeled CLKEN, couples to a second terminal of AND gate 312. The source of transistor 348 couples to node 324. The output of current source 338, a reference current $I_{REF}$, couples to the gate and the drain of transistor 332. Transistors 332, 342 and 352 form current mirrors. The gates of transistors 352, 342, and 332 are coupled together and the source terminals of these transistors are all coupled to ground.

In operation, an input voltage $V_{IN}$ is coupled to the source terminal of NFET 320 and the output voltage $V_{OUT}$ is coupled to the drain terminal of NFET 320. The current through resistor R1 is labeled $I_{R1}$, and the voltage across resistor R1 is labeled $V_{R1}$. Transistors 348 and 318 form a common gate comparator between the voltage at one terminal of resistor R1 and the input voltage $V_{IN}$.

A voltage loop from the terminal for the input voltage $V_{IN}$ to $V_{GATE}$ is represented by Equation (3):

$$V_{IN} - V_{GS(348)} + V_{GS(318)} + V_{R1} - V\text{GATE} = 0 \tag{3}$$

Because transistors 318 and 348 are matched, the $V_{GS}$ values cancel, and the simplified equation is represented by Equation (4):

$$V_{IN} + V_{R1} - V\text{GATE} = 0 \tag{4}$$

which is rewritten as Equation (5) by algebraic manipulation:

$$V_{R1} = V\text{GATE} - V_{IN} \tag{5}$$

In the embodiment 300, an NFET 320 couples the voltage $V_{IN}$ at the source terminal to an output terminal for a voltage $V_{OUT}$. Because power field-effect transistors (power FETs) are manufactured specifically for supplying substantial current to a load, the NFET 320 has a low on-resistance. During operation, the voltage $V_{OUT}$ will therefore be approximately equal to $V_{IN}$. The gate to source voltage for the NFET 320 is VGATE–$V_{IN}$, as represented by Equation (5), and the current $I_{R1}$ through the series resistor R1 is proportional to the gate to source voltage $V_{GS}$ for the power FET 320.

In the example circuit 300, the difference between the current $I_{R1}$ through the series resistor R1 and the adjustable current $I_{REF}$ are coupled at a summing node 361. The summing node 361 is at the input of the Schmitt trigger 360. The Schmitt trigger 360 has hysteresis, so that it outputs a high signal in response to the voltage at the input falling below a first threshold. The Schmitt trigger continues to output the high signal as the voltage at node 361 rises until the voltage rises above a second threshold that is greater than the first threshold. The Schmitt trigger then outputs a low signal. Because of the hysteresis, the Schmitt trigger will not "chatter" back and forth between "on" and "off" conditions as the voltage at the summing node 361 rises and falls.

Still referring to FIG. 3, the current mirror formed by transistors 352 and 332 mirror the current $I_{REF}$ from the current source 338 to the summing node 361, where the current $I_{REF}$ is subtracted from the current $I_{R1}$. In response to the current $I_{R1}$ being less than the reference current $I_{REF}$, the voltage at the input to the Schmitt trigger 360 can fall below a threshold and the output of Schmitt trigger 360 goes high. This high voltage or logic one on the signal CLKEN enables AND gate 312 to allow clock pulses from oscillator 310 to toggle at the clock input of charge pump 314. In response to the incoming clock pulses, charge pump 314 increases the gate voltage VGATE until the current $I_{R1}$ increases. The voltage at the input of the Schmitt trigger 360 will then rise above a second threshold of the Schmitt trigger 360. The Schmitt trigger 360 then outputs a low or logic zero signal on the output signal CLKEN. This low signal on CLKEN disables AND gate 312. Charge pump 314 no longer receives clocks at the input. With this arrangement, the gate-to-source voltage can be regulated to a voltage $I_{REF}*R1$.

In alternative embodiments, the Schmitt trigger 360 can be replaced with different comparators. Offset voltages at the inputs of an op-amp comparator are useful to set voltage thresholds, such as for outputting the enable signal, and for stopping the enable signal. The enable signal CLKEN can be driven by a combination of logic circuitry and other comparator types Schmitt trigger 360 is shown in FIG. 3 to provide hysteresis; however, other circuitry can provide the enable signal CLKEN, using logic circuitry and/or delay components to provide the hysteresis.

In FIG. 3, the current $I_{REF}$ can be generated by a current source 338 that is implemented using a voltage reference and a resistor (not shown) that matches resistor R1 in the process technology used. Because any temperature and process variations will affect all of resistors on an integrated circuit device in a similar manner, any dependence on temperature and process in the circuit cancels out due to a resistor ratio. In the arrangement 300, the gate to source voltage $V_{GS}$ can be reliably and accurately set to any arbitrary value as $I_{REF}*R1$. By selecting the resistance value for R1, and/or by selecting the value for the reference current $I_{REF}$, the gate-to-source voltage is controllable. By using an adjustable current source 338, or a trimmable resistor R1, adjustments can be made post-manufacture. In alternative embodiments, circuit simulations can be used to determine appropriate values for the resistor R1 and for the reference current. In additional embodiments, the reference current is dynamically adjustable to compensate for variations in the environment where the power FET 320 is used.

Figure 4:
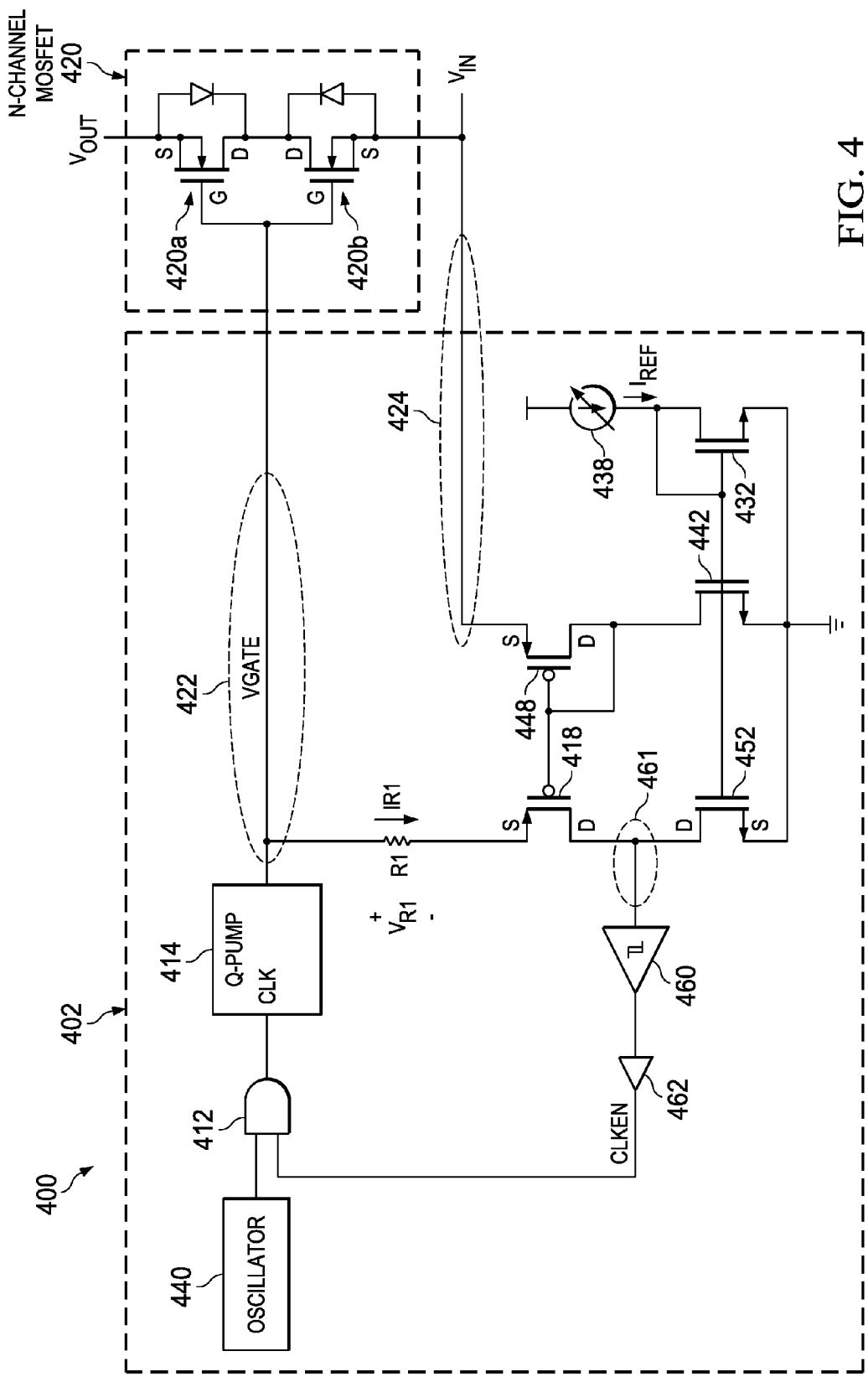
FIG. 4 is a circuit diagram of a configurable gate control circuit of example embodiments coupled to back-to-back power FETs.

FIG. 4 is a circuit diagram of another embodiment 400. In FIG. 4, a configurable gate control circuit 402 that is similar to gate control circuit 302 in FIG. 3 drives a gate terminal for back-to-back power FETs 420. The reference labels used in FIG. 4 are similar to the reference labels used for similar components in FIG. 3, for clarity. For example, Schmitt trigger 360 is similar to Schmitt trigger 460. In the example embodiment 400, a gate control circuit 402 has a gate voltage output VGATE that drives the gate terminals of power FETs 420.

In FIG. 4, the gate driver circuit 402 includes: oscillator OSC 410; AND gate 412; charge pump 414; resistor R1; a buffer 462; Schmitt trigger 460; a current source 438; a pair of PFETs 418 and 448 that are matched in size and located in close proximity to each other; and three NFETs 432, 442 and 452 that are matched in size and located in close proximity to each other. The power FETs 420 include two matched NFETs 420a and 420b with a common drain terminal connection. The back-to-back NFET arrangement prevents current flow between the input voltage terminal $V_{IN}$ and the output terminal $V_{OUT}$ when the power NFETs 420a, 420b are turned off. As shown in FIG. 4, the intrinsic body diodes of NFETs 420a, 420b block current flow in opposing directions when the NFETs are off.

FIG. 4 shows the gate driver circuit 402 coupled to the power FETs 420 at node 422 and at node 424. The power FETs 420 have both gate terminals connected to node 422. The source terminal of NFET 420b couples to node 424. Input voltage $V_{IN}$ is coupled to node 424 and the source terminal of NFET 420b, and the output voltage $V_{OUT}$ is coupled to the source terminal of NFET 420a.

Within the gate driver circuit 402, the components are coupled in a similar manner to the components of gate driver circuit 302 in FIG. 3, and the gate driver circuit 402 operates in a similar manner as gate driver circuit 302. Transistors 418, 448 form a common gate comparator circuit coupled between one terminal of resistor R1 and the input voltage $V_{IN}$.

The gate-to-source voltage for NFET 420b is represented by Equation (6):

$$V_{GS(420b)} = VGATE - V_{IN} \quad (6)$$

As shown above, the difference VGATE−$V_{IN}$ is $I_{REF}*R1$, due to the regulation technique of circuit 402, so Equation (6) is rewritten as Equation (7):

$$V_{GS(420b)} = I_{REF}*R1 \quad (7)$$

In FIG. 4, the voltage at VGATE is sensed by resistor R1, PFET 418 and PFET 448. The voltage loop from $V_{IN}$ to VGATE is represented by Equation (8):

$$V_{IN} - V_{GS}(448) + V_{GS}(418) + V_{R1} - VGATE = 0 \quad (8)$$

FETs 418 and 448 are matched, canceling the $V_{GS}$ values, and the simplified equation is represented by Equation (9):

$$V_{IN} + V_{R1} - VGATE = 0 \text{ or } V_{R1} = VGATE - V_{IN} \quad (9)$$

As discussed above, the charge pump regulation technique uses the reference current $I_{REF}$ to keep the voltage VGATE and therefore the current $I_{R1}$ in a certain range. Accordingly, the voltage $V_{R1}$ is represented by the product $I_{REF}*R1$. The gate-to-source voltage for the NFET 420a is represented by Equation (10):

$$V_{GS(420a)} = VGATE - V_{OUT} = V_{IN} + I_{REF}*R1 - V_{OUT} \quad (10)$$

Because the voltage drop due to on-resistance and current flowing across the NFETs 420a and 420b is very small, $V_{IN} \approx V_{OUT}$. By substitution and simple cancellation, voltage $V_{GS(420a)}$ is represented by Equation (11):

$$V_{GS(420a)} = I_{REF}*R1 \quad (11)$$

With the arrangement in FIG. 4, the gate-to-source voltages $V_{GS(420a)}$ and $V_{GS(420b)}$ for the NFETs can be reliably and accurately set to any arbitrary value as $I_{REF}*R1$. The regulated gate-to-source voltages have no dependence on threshold voltages or leakage currents of any devices. By forming the resistances used in the current source 438 with the same resistor type as R1 in the same technology, any temperature and process dependence due to the use of the resistors in the current source 438 is also removed from the gate voltage regulation of circuit 402.

In FIG. 4, the NFETs 420a and 420b can be a standalone integrated circuit. The gate driver circuit 402 can be another standalone integrated circuit. In further alternative embodiments, the oscillator 440 can be a component that is external to the gate driver circuit 402. In more alternatives, gate driver circuit 402 can include discrete components. Circuit boards with discrete components and/or integrated circuits, multi-chip modules and highly integrated circuits can be used to implement the gate driver circuit 402 and the power FETs 420. In one example, all of the components in the embodiment 400 can be formed on a single board. In another example, all of the components in FIG. 4 can be formed as an integrated circuit.

Figure 5:
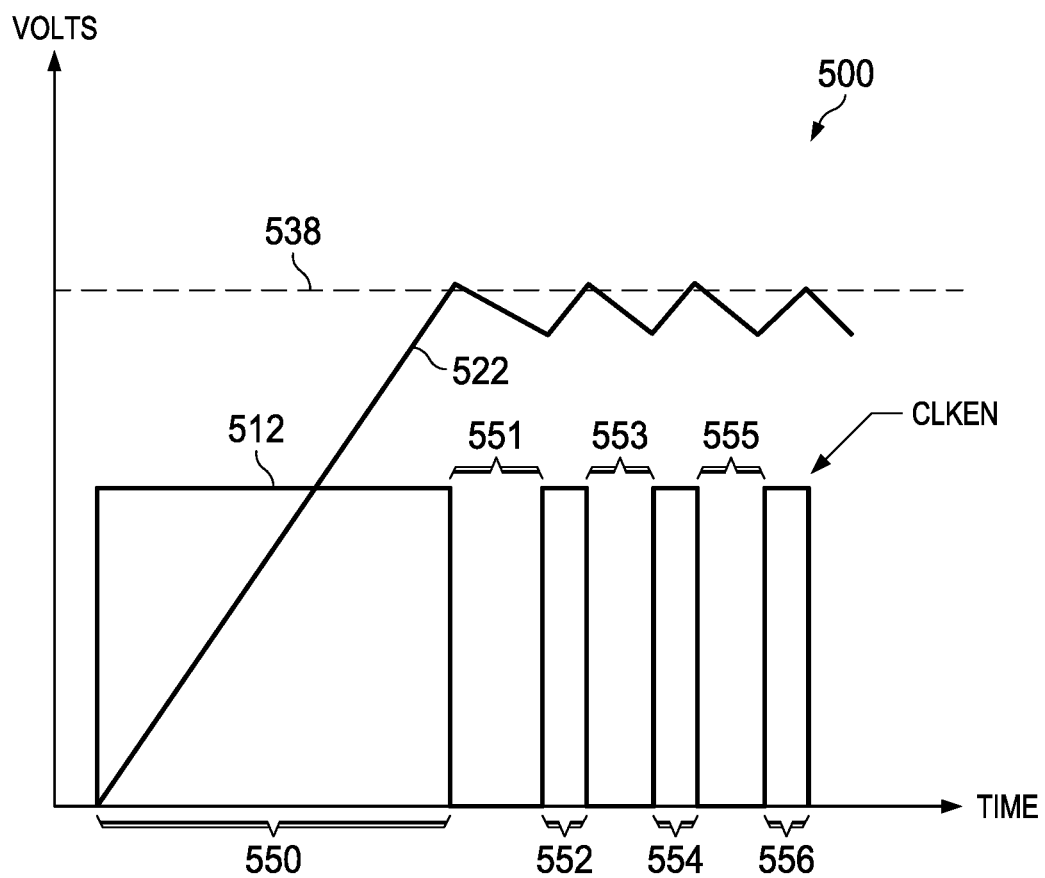
FIG. 5 is a timing diagram illustrating waveforms of the gate voltage and charge pump enable signals of the circuit of FIG. 4.

FIG. 5 is a timing diagram 500 showing the gate voltage and the signal CLKEN of circuit 402 of FIG. 4. In timing diagram 500, time is shown on the horizontal axis increasing to the right; the voltage is shown on the vertical axis increasing from the origin. Data line 538 shows an arbitrary target gate voltage. Data line 522 is the gate voltage VGATE and data line 512 shows the CLKEN signal of FIG. 4, corresponding to the output of Schmitt trigger 460. Seven sequential periods, 550 through 556, are indicated along the X-axis.

In period 550, charge pump 414 (see FIG. 4) is enabled with signal CLKEN high, this results in the gate voltage VGATE shown in data trace 522 ramping up to the target gate voltage 538 at the end of period 550. At this time, the output CLKEN of the Schmitt trigger 460 falls and the AND gate 412 is disabled. Because the clock signal into the charge pump stops, the charge pump stops generating power, reducing power consumption and letting the gate voltage VGATE fall. As a result, the gate voltage trace 522 begins to fall until the end of period 551. In response to the gate voltage VGATE being below a threshold where $I_{R1}<I_{REF}$, the output of the Schmitt trigger 460 again rises, enable signal CLKEN rises, and the output of the AND gate 412 goes high again during period 552. Again, the gate voltage shown in trace 522 climbs back to the desired gate voltage 538. In the following periods 553 and 555, the Schmitt trigger 460 outputs a low signal and the output of the AND gate 412 falls, disabling clocks to the charge pump and allowing the gate voltage shown in data trace 522 to fall, so that the current $I_{R1}$ is below the reference current $I_{REF}$. In subsequent periods 554 and 556, CLKEN is high causing the gate voltage shown in data trace 522 to climb back to the desired gate voltage 538. The data trace 522 illustrates the regulation of the gate voltage. In periods 551, 553 and 555, the signal CLKEN is low. In response to the enable signal CLKEN being low, the charge pump is not operating nor using power. By not providing the clock signal to the charge pump in these periods, power consumption is reduced.

FIGS. 6A-6C show in three timing diagrams simulation results illustrating the gate voltage regulation by the circuit 402 of FIG. 4. In the timing diagrams, time is on the horizontal axis and increases to the right of the origin in each diagram. The vertical axis for each of the waveforms plots volts. In FIG. 6A, trace 622 shows the gate voltage VGATE of FIG. 4. In FIG. 6B, the waveform 612 plots the output of the Schmitt trigger 460 which corresponds to the CLKEN signal in FIG. 4. IN FIG. 6C, waveform 614 plots the clocks at the clock input to the charge pump 414. In FIGS. 6A-6C, four time periods are indicated labeled 650, 651, 652, and 653.

In operation, beginning at time 0.0 in period 650, the voltage VGATE in trace 622 in FIG. 6A is zero, the output of the AND gate 412 shown in trace 612 in FIG. 6B is active, and the clock signal into the charge pump 414, shown in trace 614 in FIG. 6C, is toggling. (The period of the clock in data trace 614 is short, so the multiple clocks appear as a single block in this waveform.) By the end of period 650, the gate voltage 622 in FIG. 6A has reached the desired value of 10V. At the start of period 651, the output of the AND gate 412 shown in trace 612 in FIG. 6B is low. In this condition, no clock pulses are coupled to the charge pump 414 as by data trace 614 shown in FIG. 6C. During period 651, the gate voltage in trace 622 in FIG. 6A falls, and by the end of period 651, the gate voltage 622 in FIG. 6A is below the level where the current $I_{R1}$ is less than the reference current $I_{REF}$. In period 652, in trace 612 in FIG. 6B the output of the AND gate (412 in FIG. 4) goes high enabling charge pump to receive the clocks as shown in data trace 614 shown in FIG. 6C. In this simulation, only a few clock pulses are needed to regulate the gate voltage (shown in data trace 622 in FIG. 6A) back to 10V. In period 653, the simulation shows repeated regulation patterns similar to those in periods 651 and 652 where the clock signal to the charge pump 414 (shown as data trace 614 in FIG. 6C) is enabled to elevate the gate voltage VGATE (shown as data trace 622 in FIG. 6A) to desired levels, and then disabled. Data traces 622 and 612 illustrate the regulation of the gate voltage by the clock enable circuitry of FIG. 4.

Figure 7:
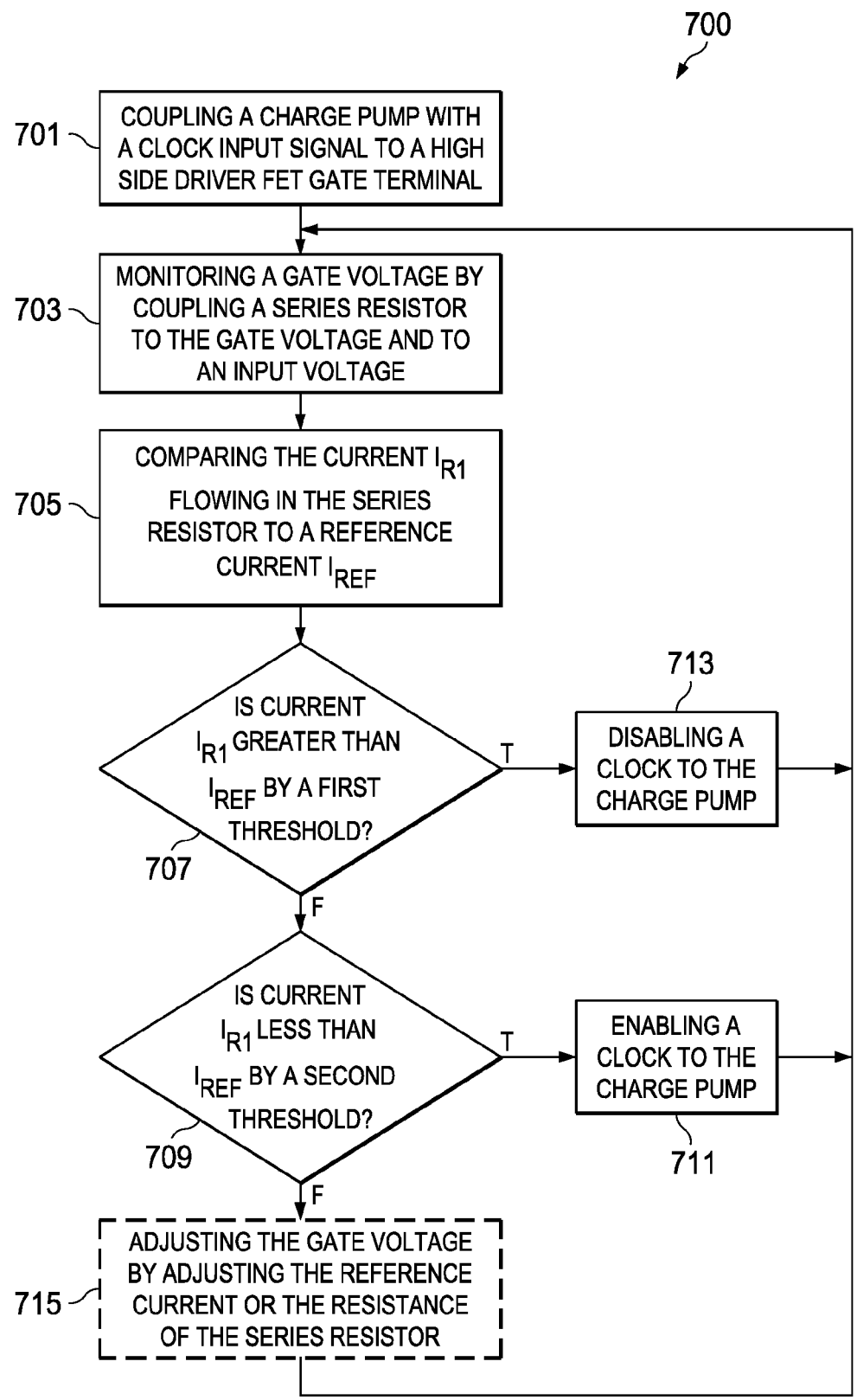
FIG. 7 is a flow diagram of a method embodiment.

FIG. 7 is a flow diagram a method 700 performed by circuits of example embodiments. In FIG. 7, the method begins at step 701. A charge pump (such as 314 in FIG. 3, or 414 in FIG. 4) with a clock input signal CLK is coupled to the gate terminal of at least one high side driver FET (such as 320 in FIG. 3, or 420 in FIG. 4). In step 703, the method begins monitoring the gate voltage by coupling a series resistor (such as R1 in FIGS. 3 and 4) between the gate voltage (VGATE in FIG. 3 or FIG. 4) and an input voltage ($V_{IN}$ in FIG. 3 or FIG. 4). In step 705, a comparison is made between the current through the series resistor $I_{R1}$ and a reference current $I_{REF}$. The comparison can be made by coupling the currents IR1 and $I_{REF}$ to the node 361 as shown in FIG. 3, or to node 461 as shown in FIG. 4, and inputting the resulting voltage as the input to the Schmitt trigger (360 in FIG. 3, 460 in FIG. 4). At step 707, a decision is made. If the current $I_{R1}$ through the series resistor is greater than the reference current $I_{REF}$ by a first threshold, then the method transitions to step 713. This step represents the operation when the input to the Schmitt trigger (360 in FIG. 3, 460 in FIG. 4) is greater than a first threshold. At step 713, the clock to the charge pump 314 or 414 is disabled by the output of Schmitt trigger (360 in FIG. 3 or 460 in FIG. 4) and the buffer (362 in FIG. 3 or 462 in FIG. 4), which is coupled to the input of the AND gate (312 in FIG. 3 or 412 in FIG. 4). If the decision is block 707 is false, the method transitions to a second decision block at 709.

In decision block 709, if the current $I_{R1}$ flowing through the series resistor is less than the reference current $I_{REF}$ by a second threshold, then the method transitions to step 711, and a clock is enabled to the charge pump 314 or 414 by the output of Schmitt trigger 360 or 460 and the buffer (362 in FIG. 3, or 462 in FIG. 4), which is coupled to the input of AND gate (312 in FIG. 3 or 412 in FIG. 4).

If the decision in block 709 is false, the FET gate voltage is at a desired level, and no action is taken. An optional step 715 shows that adjustment of the gate voltage can be made by adjusting either: the series resistor R1 (in FIG. 3 or FIG. 4); or the reference current ($I_{REF}$ in FIG. 3 or FIG. 4). The method then returns to step 703 and continues monitoring the gate voltage. By repetitively enabling and disabling the clock pulses to the charge pump (314 in FIG. 3, or 414 in FIG. 4), the gate voltage is regulated. The reference current ($I_{REF}$ in FIG. 3 or FIG. 4) and the resistance of the series resistor (R1 in FIG. 3 or FIG. 4) is adjustable to set the gate voltage.

Modifications are possible in the described embodiments, and other embodiments are possible within the scope of the claims.

What is claimed is:

1. Apparatus, comprising:
a transistor having: a source and a drain coupled between an input voltage terminal and an output voltage terminal; and a gate terminal;
a charge pump having: an output node coupled to the gate terminal; and a clock input;
an oscillator coupled to generate a clock signal;
a clock enable circuit coupled to: receive the clock signal; and selectively output the clock signal to the clock input, responsive to an enable signal; and
a comparator coupled to output the enable signal to the clock enable circuit in response to: a comparison between a reference current and a current through a series resistor; and a voltage at the gate terminal being lower than a predetermined gate voltage level; wherein the series resistor is coupled to the gate terminal.

2. The apparatus of claim 1, wherein the comparator is a Schmitt trigger.

3. The apparatus of claim 2, wherein a voltage at an input node of the comparator falls in response to the current through the series resistor being lower than the reference current.

4. The apparatus of claim 3, wherein the Schmitt trigger is coupled to output a high signal in response to a voltage at the input node falling below a threshold voltage.

5. The apparatus of claim 3, wherein the Schmitt trigger is coupled to output a low signal in response to a voltage at the input node rising above a threshold voltage.

6. The apparatus of claim 1, wherein the charge pump is coupled to increase a voltage at the gate terminal, responsive to receiving clock pulses at the clock input.

7. The apparatus of claim 1, wherein a voltage at the gate terminal is adjustable by adjusting at least one of the reference current and the series resistor.

8. The apparatus of claim 1, wherein a voltage output by the charge pump at the gate terminal is regulatable to a predetermined voltage level.

9. Apparatus, comprising:
a transistor having: a source and a drain coupled between an input voltage terminal and an output voltage terminal; and a gate terminal;
a charge pump having: an output node coupled to the gate terminal; and a clock input;
an oscillator coupled to generate a clock signal;
a clock enable circuit coupled to: receive the clock signal; and selectively output the clock signal to the clock input, responsive to an enable signal;
a comparator coupled to output the enable signal to the clock enable circuit in response to a comparison between a reference current and a current through a series resistor; wherein the series resistor is coupled to the gate terminal;
a reference current source coupled to generate the reference current; and
a current mirror coupled to mirror the reference current, and having an output node coupled to an input node of the comparator.

10. Apparatus, comprising:
a first transistor having: a source and a drain coupled between an input voltage terminal and an output voltage terminal; and a gate terminal;
a charge pump having: an output node coupled to the gate terminal; and a clock input;
an oscillator coupled to generate a clock signal;
a clock enable circuit coupled to: receive the clock signal; and selectively output the clock signal to the clock input, responsive to an enable signal;
a comparator coupled to output the enable signal to the clock enable circuit in response to a comparison between a reference current and a current through a series resistor; wherein the series resistor is coupled to the gate terminal;
a second transistor having a source terminal coupled to the input voltage terminal and a gate coupled to a common gate terminal; and
a third transistor having a gate coupled to the common gate terminal and having a source terminal coupled to one terminal of the series resistor;
wherein the second and third transistors are coupled to make the current through the series resistor proportional to a difference between a voltage at the gate terminal and a voltage at the input voltage terminal, divided by a resistance of the series resistor.

11. A gate driver integrated circuit for providing a gate voltage to a power FET having a current conduction path coupled between an input terminal and an output terminal, comprising:
a charge pump having: a clock input; and an output node coupled to a gate voltage output terminal;
a clock enable circuit coupled to: receive clock pulses from an oscillator; and selectively output the clock pulses to the clock input, responsive to a clock enable signal;
a comparator coupled to: compare a voltage at a summing node to a threshold; and output the clock enable signal in response to the comparison;
a series resistor coupled between the gate voltage output terminal and the summing node; and
a reference current source coupled to the summing node.

12. The gate driver integrated circuit of claim 11, wherein the comparator is coupled to output a high voltage on the clock enable signal in response to the voltage at the summing node falling below a first threshold.

13. The gate driver integrated circuit of claim 11, wherein the comparator is configured to output a low voltage on the clock enable signal in response to the voltage at the summing node rising above a second threshold.

14. The gate driver integrated circuit of claim 11, wherein the comparator is a Schmitt trigger.

15. The gate driver integrated circuit of claim 11, comprising:
a first transistor having a source terminal coupled to the input terminal and having a first gate at a common gate terminal;
a second transistor having a second gate at the common gate terminal and having a source terminal at a first terminal of the series resistor; and
the series resistor having a second terminal coupled to the gate voltage output terminal;
wherein the first and second transistors are coupled to make a current through the series resistor proportional to a difference between a voltage at the gate voltage output terminal and a supply voltage at the input terminal, divided by a resistance of the series resistor.

16. The gate driver integrated circuit of claim 11, comprising:
a current mirror coupled to receive a reference current from the reference current source and coupled to supply the reference current to the summing node, so that a current at the summing node is proportional to a difference between a current through the series resistor and the reference current.

17. The gate driver integrated circuit of claim 16, wherein the gate driver integrated circuit is coupled to output a voltage at the gate voltage output terminal that is directly proportional to a resistance of the series resistor and to the reference current.

18. A method for controlling a gate voltage to a driver transistor having a conduction path coupled between an input voltage and an output terminal, comprising:
supplying a gate voltage from a charge pump to a gate terminal of a driver transistor, responsive to an enable signal;
monitoring the gate voltage by coupling a series resistor between the gate voltage and an input voltage, and coupling a current through the series resistor to a summing node;
coupling a reference current to the summing node;
comparing a voltage at the summing node to a first threshold, and outputting a high voltage on the enable signal in response to the voltage being less than the first threshold; and
comparing the voltage at the summing node to a second threshold, and outputting a low voltage on the enable signal in response to the voltage being greater than a second threshold.

19. The method of claim 18, comprising:
adjusting the voltage at the gate terminal by adjusting at least one of a resistance of the series resistor and the reference current.

* * * * *